United States Patent
Chen et al.

(10) Patent No.: US 11,948,948 B2
(45) Date of Patent: Apr. 2, 2024

(54) DETECTION SUBSTRATE AND RAY DETECTOR

(71) Applicant: BOE Technology Group Co., Ltd., Beijing (CN)

(72) Inventors: Jiangbo Chen, Beijing (CN); Fanli Meng, Beijing (CN); Zeyuan Li, Beijing (CN); Yao Lu, Beijing (CN); Liye Duan, Beijing (CN); Yanzhao Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 231 days.

(21) Appl. No.: 17/406,951

(22) Filed: Aug. 19, 2021

(65) Prior Publication Data

US 2022/0093658 A1 Mar. 24, 2022

(30) Foreign Application Priority Data

Sep. 24, 2020 (CN) .................... 202011017909.X (51) Int. Cl.
*H01L 27/146* (2006.01)

(52) U.S. Cl.
CPC .. *H01L 27/14603* (2013.01); *H01L 27/14614* (2013.01); *H01L 27/14623* (2013.01); *H01L 27/14659* (2013.01); *H01L 27/14663* (2013.01)

(58) Field of Classification Search
CPC ......... H01L 27/14603; H01L 27/14614; H01L 27/14623; H01L 27/14659; H01L 27/14663; H01L 27/14658; H01L 27/14609; H04N 25/709
See application file for complete search history.

(56) References Cited

U.S. PATENT DOCUMENTS

| 2009/0065680 A1* | 3/2009 | Okada ............... H01L 27/14683 250/208.1 |
| 2010/0320391 A1* | 12/2010 | Antonuk ................. G01T 1/241 257/E31.124 |
| 2020/0200925 A1* | 6/2020 | Jeon ........................ G01T 1/241 |
| 2021/0149063 A1 | 5/2021 | Liang et al. |

FOREIGN PATENT DOCUMENTS

| CN | 109407141 A | 3/2019 |
| CN | 110854147 A | 2/2020 |

OTHER PUBLICATIONS

CN202011017909.X first office action.

* cited by examiner

*Primary Examiner* — Samuel Park
(74) *Attorney, Agent, or Firm* — IPro, PLLC (57) ABSTRACT

A detection substrate and a ray detector are disclosed. The detection substrate includes a base substrate; a plurality of detection pixel circuits, located on the base substrate; a first passivation layer, located on the side, facing away from the base substrate, of the detection pixel circuits; a planarization layer, located on the side, facing away from the base substrate, of the first passivation layer, where the surface of the side, facing away from the first passivation layer, of the planarization layer is a plane; and a plurality of photosensitive devices; where the photosensitive devices are electrically connected to the detection pixel circuits in a one-to-one correspondence through vias penetrating through the first passivation layer and the planarization layer, and each photosensitive device includes a first portion and a second portion.

11 Claims, 10 Drawing Sheets

DETECTION SUBSTRATE AND RAY DETECTOR

The present application claims the priority from Chinese Patent Application No. 202011017909.X, filed with the Chinese Patent Office on Sep. 24, 2020, and entitled "DETECTION SUBSTRATE AND RAY DETECTOR", which is hereby incorporated by reference in its entirety.

FIELD

The present disclosure relates to the technical field of photoelectric detection, in particular to a detection substrate and a ray detector.

BACKGROUND

An X-ray detection technology is widely used in fields such as industrial non-destructive testing, container scanning, circuit board inspection, medical treatment, security, industry, and has wide application prospects. Traditional X-Ray imaging techniques belong to analog signal imaging, with low resolution and poor image quality. X-ray digital radio graphy (DR), which emerged in the late 1990s, employs an X-ray flat panel detector to directly convert X images into digital images, with significant advantages such as ease of operation, fast imaging speed, high imaging resolution, clarity in converted digital images, ease of digital image storage and delivery, thus becoming the dominant direction of digital radiography, and being recognized by clinical institutions and experts in imagology in countries around the world.

SUMMARY

A detection substrate provided by the embodiments of the present disclosure includes:
 a base substrate;
 a plurality of detection pixel circuits, located on the base substrate;
 a first passivation layer, located on the side, facing away from the base substrate, of the plurality of detection pixel circuits;
 a planarization layer, located on the side, facing away from the base substrate, of the first passivation layer, where the surface of the side, facing away from the first passivation layer, of the planarization layer is a plane; and
 a plurality of photosensitive devices; where the plurality of photosensitive devices are electrically connected to the plurality of detection pixel circuits in a one-to-one correspondence through vias penetrating through the first passivation layer and the planarization layer; each photosensitive device includes a first portion and a second portion; an orthographic projection of the first portion on the base substrate and an orthographic projection of the detection pixel circuit correspondingly electrically connected with the first portion on the base substrate overlap each other; and an orthographic projection of the second portion on the base substrate and an orthographic projection of the detection pixel circuit correspondingly electrically connected with the second portion on the base substrate do not overlap each other.

In some embodiments, in the detection substrate provided by the embodiments of the present disclosure, the planarization layer is a lightproof resin layer.

In some embodiments, in the detection substrate provided by the embodiments of the present disclosure, the planarization layer has a thickness of 1µm-10µm in a direction perpendicular to the base substrate.

In some embodiments, the detection substrate provided by the embodiments of the present disclosure further includes a second passivation layer located between the planarization layer and the plurality of photosensitive devices.

In some embodiments, in the detection substrate provided by the embodiments of the present disclosure, the each photosensitive device includes a first electrode and a second electrode that are opposite to each other, and a direct conversion material layer located between the first electrode and the second electrode;
 where the first electrode is electrically connected to the detection pixel circuit;
 the second electrode is located on the side, facing away from the first electrode, of the direct conversion material layer; and the second electrode is configured to load a bias voltage.

In some embodiments, in the detection substrate provided by the embodiments of the present disclosure, the first electrode includes a light-shielding metal layer, and a light-transmitting metal oxide layer located between the light-shielding metal layer and the direct conversion material layer.

In some embodiments, the detection substrate provided by the embodiments of the present disclosure further includes a scintillator layer located on the side, facing away from the base substrate, of the plurality of photosensitive devices;
 where the each photosensitive device includes a third electrode and a fourth electrode that are opposite to each other, and an indirect conversion material layer located between the third electrode and the fourth electrode;
 the indirect conversion material layer includes an N-type semiconductor layer, an intrinsic semiconductor layer and a P-type semiconductor layer;
 the third electrode is electrically connected to the detection pixel circuit;
 the fourth electrode is a transparent electrode and configured to load a bias voltage; and the fourth electrode is located on the side, facing away from the third electrode, of the indirect conversion material layer.

In some embodiments, the detection substrate provided by the embodiments of the present disclosure further includes a scintillator layer located on the side, facing away from the base substrate, of the plurality of photosensitive devices;
 where the each photosensitive device includes a semiconductor layer; a dielectric layer located on the side, facing away from the scintillator layer, of the semiconductor layer; and a fifth electrode and a sixth electrode located between the dielectric layer and the planarization layer and arranged on the same layer;
 where the fifth electrode and the sixth electrode constitute an interdigital electrode, the fifth electrode is electrically connected to the detection pixel circuit, and the sixth electrode is configured to load a bias voltage.

In some embodiments, in the detection substrate provided by the embodiments of the present disclosure, the each detection pixel circuit includes a transistor and a capacitor; where a gate of the transistor and a first electrode plate of the capacitor are arranged on the same layer; and a source and a drain of the transistor and a second electrode plate of the capacitor are arranged on the same layer; and the drain of the transistor and the second electrode plate of the capacitor are electrically connected to the photosensitive device.

In some embodiments, the detection substrate provided by the embodiments of the present disclosure further includes a gate line arranged on the same layer as the gate of the transistor and extending in a first direction; and a data line and a reference signal line arranged on the same layer as the source and drain of the transistor and extending in a second direction intersecting the first direction;

where the gate line is electrically connected to the gate of the transistor, the data line is electrically connected to the source of the transistor, and the reference signal line is electrically connected to the first electrode plate of the capacitor.

In some embodiments, in the detection substrate provided by the embodiments of the present disclosure, orthographic projections of the photosensitive devices on the base substrate completely cover an orthographic projection of the gate line on the base substrate, and an orthographic projection of the each photosensitive device on the base substrate partially overlaps with an orthographic projection of the data line on the base substrate and an orthographic projection of the reference signal line on the base substrate.

Based on the same inventive concept, embodiments of the present disclosure also provide a ray detector, including the above-mentioned detection substrates.

DETAILED DESCRIPTION OF THE EMBODIMENTS

In order to make the objectives, technical solutions, and advantages of the embodiments of the present disclosure clearer, the technical solutions of the embodiments of the present disclosure will be described clearly and completely in conjunction with the accompanying drawings of the embodiments of the present disclosure. It should be noted that the size and shape of each figure in the drawings do not reflect the true scale, and the purpose is only to illustrate the content of the present disclosure. In addition, the same or similar reference signs indicate the same or similar elements or elements with the same or similar functions. Obviously, the described embodiments are a part of the embodiments of the present disclosure, rather than all of the embodiments. Based on the described embodiments of the present disclosure, all other embodiments obtained by those of ordinary skill in the art without creative work fall within the scope of protection of the present disclosure.

Unless otherwise defined, the technical terms or scientific terms used herein shall be the ordinary meanings understood by those with ordinary skills in the field to which the present disclosure belongs. The "first", "second" and similar words used in the description and claims of the present disclosure do not denote any order, quantity or importance, but are only used to distinguish different components. Words such as "including" or "include" and other similar words mean that the element or item appearing before the word covers the elements or items listed after the word and their equivalents, but does not exclude other elements or items. Words such as "inner", "outer", "upper", "lower" are only used to indicate the relative position relationship. When the absolute position of the described object changes, the relative position relationship may also change accordingly.

In the current detection substrate, due to the poor uniformity of the film layers above the projection of the detection pixel circuit, the step difference is about 5000 Å or above, so that during the detection pixel design, the photosensitive device cannot cover the area where the detection pixel circuit is located, so as to cause a certain loss to the filling rate of the detection pixels.

Figure 1:
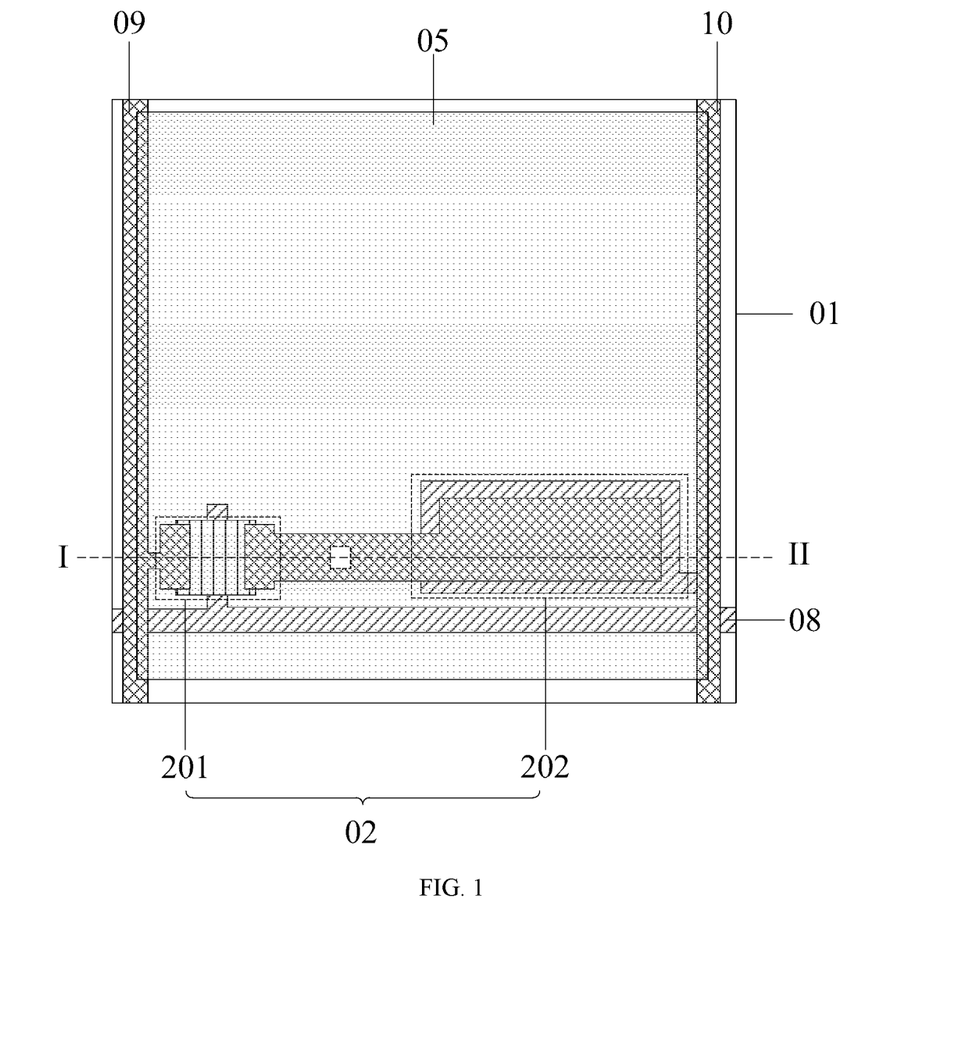
FIG. 1 is a schematic diagram of a planar structure of a detection substrate provided by an embodiment of the present disclosure.
Figure 2:
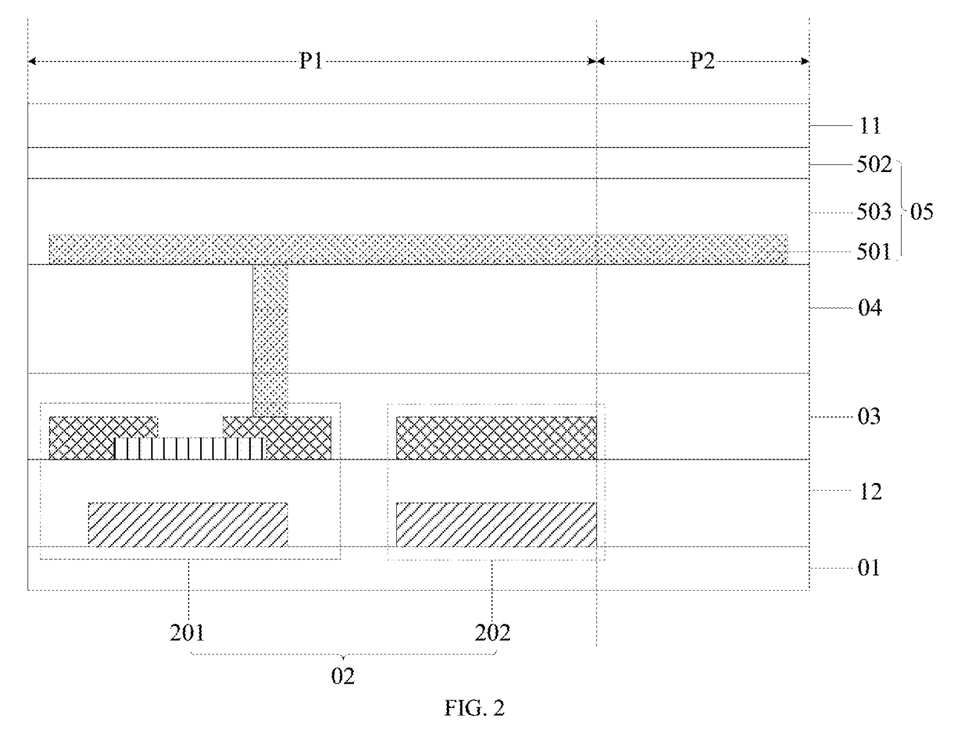
FIG. 2 is a schematic diagram of a sectional structure along the line I-II in FIG. 1.

Aiming at the above-mentioned problems existing in the related art, embodiments of the present disclosure provide a detection substrate, as shown in FIG. 1 and FIG. 2, including:

a base substrate 01;

a plurality of detection pixel circuits 02, located on the base substrate 01;

a first passivation layer 03, located on a side, facing away from the base substrate 01, of the plurality of detection pixel circuits 02;

a planarization layer 04, located on a side, facing away from the base substrate 01, of the first passivation layer 03; where a surface of the side, facing away from the first passivation layer 03, of the planarization layer 04 is a plane; and a plurality of photosensitive devices 05; where the plurality of photosensitive devices 05 are electrically connected to the plurality of detection pixel circuits 02 in a one-to-one correspondence through vias penetrating through the first passivation layer 03 and the planarization layer 04; and each photosensitive device 05 includes a first portion P1 and a second portion P2; the orthographic projection of the first portion P1 on the base substrate 01 and the orthographic projection of the detection pixel circuit 02 correspondingly electrically connected with the first portion P1 on the base substrate overlap each other; and the orthographic projection of the second portion P2 on the base substrate 01 and the orthographic projection of the detection pixel circuit 02 correspondingly electrically connected with the second portion P2 on the base substrate do not overlap each other.

In the above-mentioned detection substrate provided by the embodiments of the present disclosure, since the surface of the side, facing away from the first passivation layer 03, of the planarization layer 04 is a plane with good uniformity, so that film layers of the photosensitive device 05 fabricated on the planarization layer 04 are excellent in uniformity; and further the photosensitive device 05 may include the first portion P1 that overlaps with the detection pixel circuit 02 and the second portion P2 that does not overlap with the detection pixel circuit 02. Compared with a technical solution in the related art that the photosensitive device 05 and the detection pixel circuit 02 do not overlap each other, the present disclosure increases the filling rate of the detection pixels due to the fact that the photosensitive device 05 and the detection pixel circuit 02 can overlap each other.

Optionally, in order to maximize the filling rate, the first portion P1 of the photosensitive device 05 may be set to completely cover the detection pixel circuit 02. Of course, in specific implementation, the photosensitive device 05 may also partially cover the detection pixel circuit 02, which is not limited here. In addition, the material of the first passivation layer 03 may be silicon oxide, silicon nitride, etc., and the thickness of the first passivation layer 03 may be in the range of 500 Å-20000 Å.

Optionally, in the detection substrate provided by the embodiments of the present disclosure, the planarization layer 04 is a lightproof resin layer, such as a lightproof polyimide (PI) layer. The planarization layer 04 is made of the light-proof resin layer, so that visible light can be effectively shielded and be prevented from being irradiated to the transistors contained in the detection pixel circuits below the planarization layer 04, thereby improving the stability of the transistors. In addition, in order to ensure the effect of shielding the visible light, the transmittance of the planarization layer 04 to visible light can be in the range of 0%-50%.

Optionally, in the above-mentioned detection substrate provided by the embodiments of the present disclosure, in order to achieve a better planarization effect, the thickness of the planarization layer 04 in the direction perpendicular to the base substrate 01 may be 1 μm-10 μm.

Figure 3:
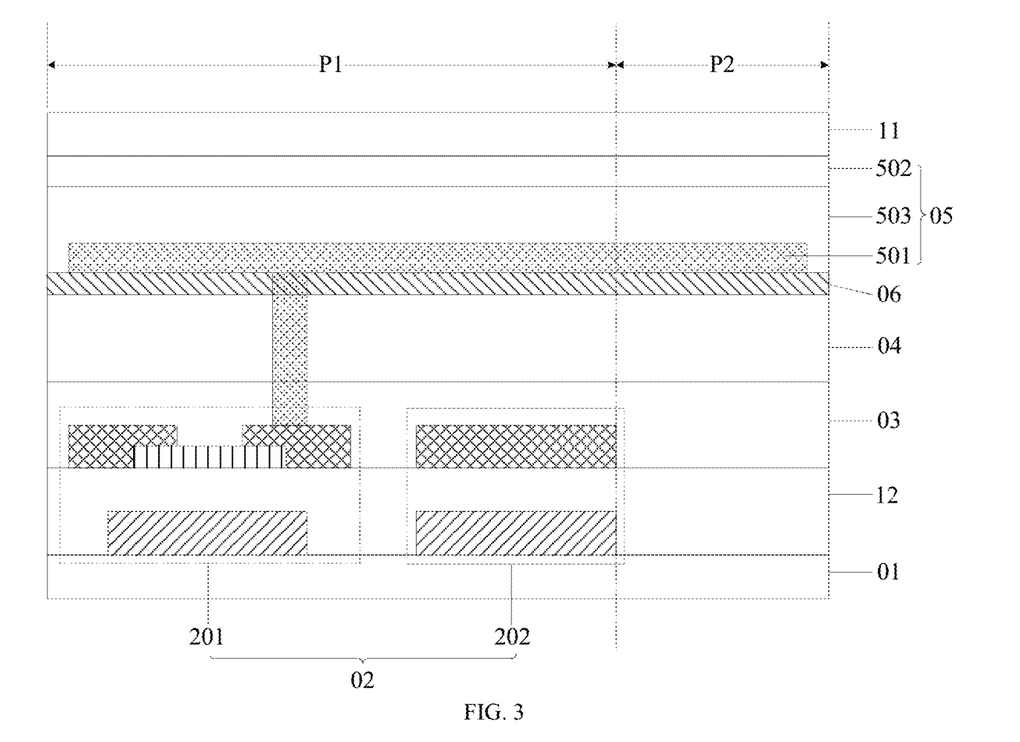
FIG. 3 is a schematic diagram of another sectional structure along the line I-II in FIG. 1.

Optionally, the above-mentioned detection substrate provided by the embodiments of the present disclosure, as shown in FIG. 3, may further include a second passivation layer 06 located between the planarization layer 04 and the plurality of photosensitive devices 05. Generally, the adhesion of the resin layer is slightly poor, so that when the planarization layer 04 is made of light-proof resin, the second passivation layer 06 can be fabricated on the planarization layer 04 to effectively increase the adhesion to the photosensitive devices 05. Optionally, the material of the second passivation layer 06 may be silicon oxide, silicon nitride, etc.

Optionally, in the detection substrate provided by the embodiments of the present disclosure, the photosensitive device 05 may be a direct conversion type photosensitive device or an indirect conversion type photosensitive device.

Specifically, when the photosensitive device 05 is a direct conversion type photosensitive device, as shown in FIG. 2 and FIG. 3, each photosensitive device 05 may include: a first electrode 501 and a second electrode 502 that are opposite to each other, and a direct conversion material layer 503 located between the first electrode 501 and the second electrode 502;
  wherein the first electrode 501 is electrically connected to the detection pixel circuit 02;
  the second electrode 502 is located on the side, facing away from the first electrode 501, of the direct conversion material layer 503; and the second electrode 501 is configured to load a bias voltage.

During the X-ray detection process, the direct conversion material layer 503 can absorb X-rays to generate carriers. Electron-hole pairs contained in the carriers drift towards the first electrode 501 and the second electrode 502 respectively under the action of an electric field, and are directly collected by the first electrode 501 and the second electrode 502 to generate a current signal. Optionally, the material of the direct conversion material layer 503 may be mercury iodide ($HgI_2$), lead iodide ($PbI_2$), bismuth iodide ($BiI_2$), and the like.

Figure 4:
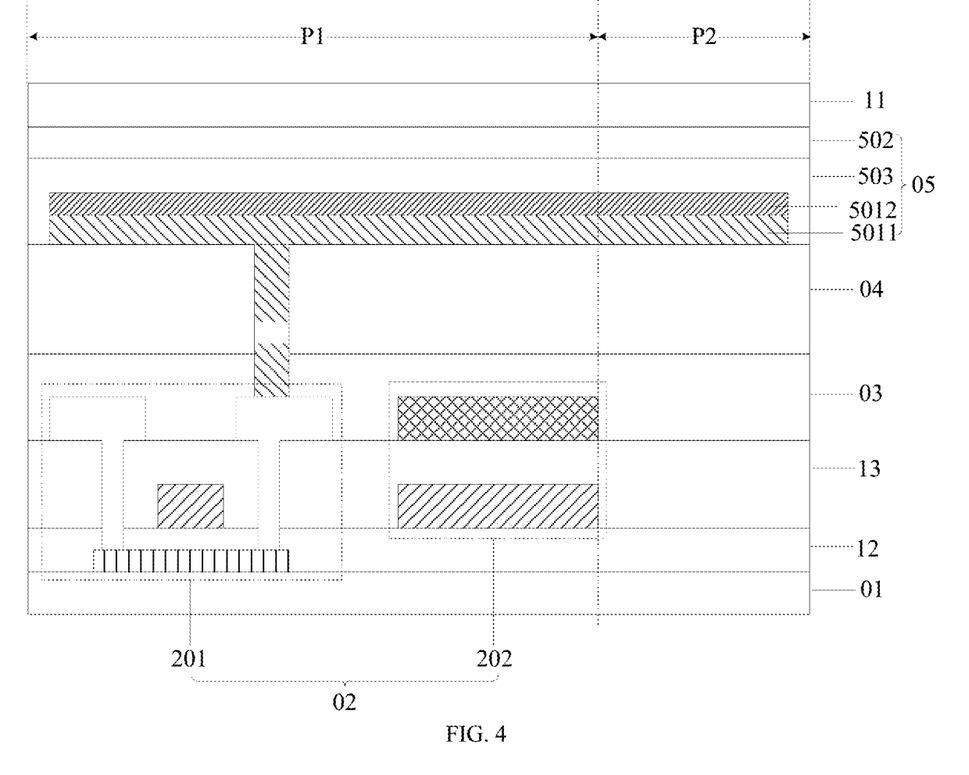
FIG. 4 is a schematic diagram of another sectional structure along the line I-II in FIG. 1.

Generally, the first electrode 501 is a transparent electrode made of indium tin oxide (ITO). In the present disclosure, to further prevent visible light from being irradiated to the transistors contained in the detection pixel circuits, as shown in FIG. 4, the first electrode 501 may be set to include: a light-shielding metal layer 5011, and a light-transmitting metal oxide layer 5012 located between the light-shielding metal layer 5011 and the direct conversion material layer 503. In specific implementation, the material of the light-shielding metal layer 5011 may be metals or alloys such as copper (Cu), silver (Ag), aluminum (Al), molybdenum (Mo), chromium (Cr) and titanium (Ti); and the material of the light-transmitting metal oxide layer 5012 may be light-transmitting metal oxides such as ITO and indium zinc oxide (IZO).

Specifically, when the photosensitive device 05 is an indirect conversion type photosensitive device, it can be a PIN-type photosensitive device or an MSM-type photosensitive device.

Figure 5:
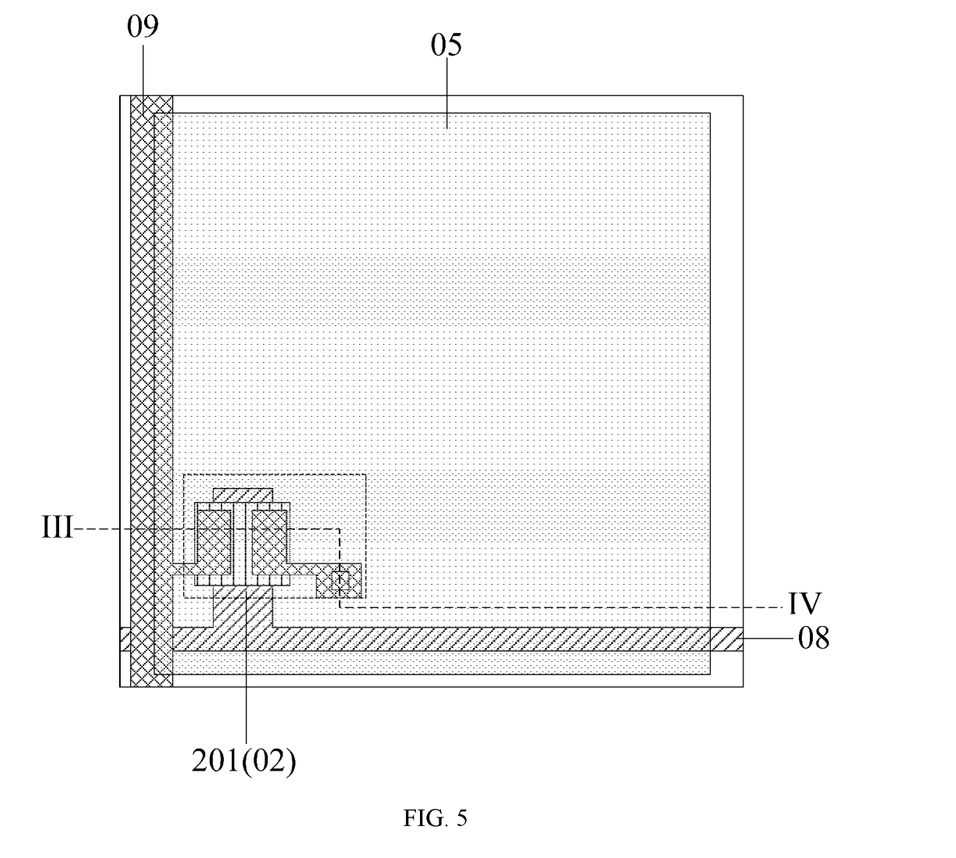
FIG. 5 is a schematic diagram of another planar structure of a detection substrate provided by an embodiment of the present disclosure.
Figure 6:
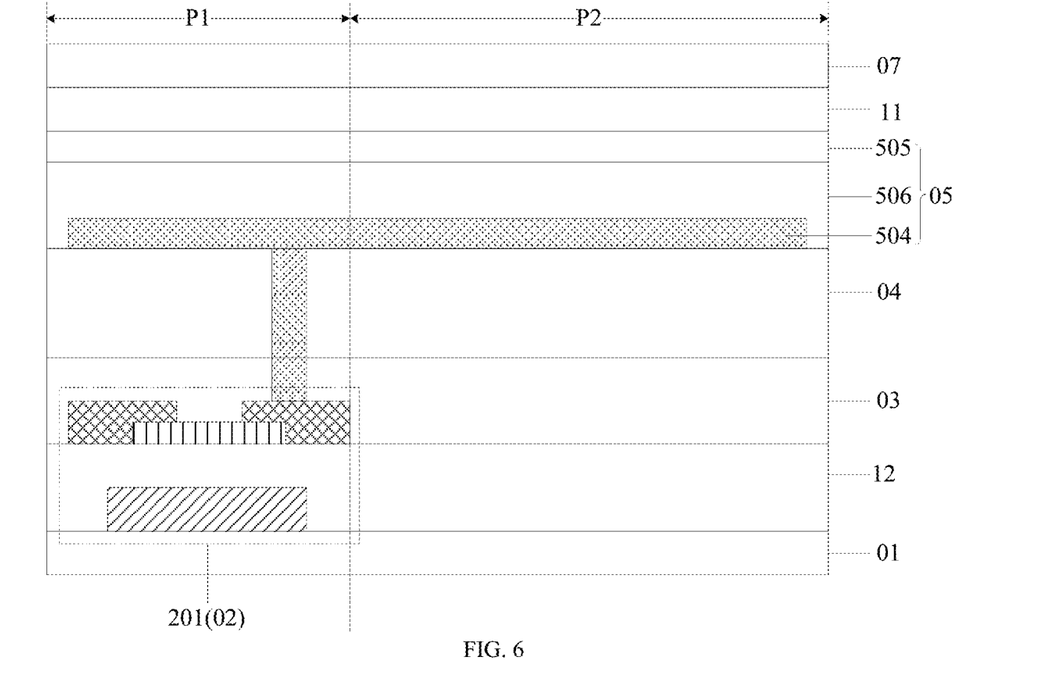
FIG. 6 is a schematic diagram of a sectional structure along the line III-IV in FIG. 5.

Optionally, when the photosensitive device 05 is the PIN-type photosensitive device, as shown in FIG. 5 and FIG. 6, the detection substrate may further include: a scintillator layer 07 located on the side, facing away from the base substrate, of the plurality of photosensitive devices 05;
  each photosensitive device 05 may include: a third electrode 504 and a fourth electrode 505 that are opposite to each other, and an indirect conversion material layer 506 located between the third electrode 504 and the fourth electrode 505;
  the indirect conversion material layer 506 includes: an N-type semiconductor layer, an intrinsic semiconductor layer and a P-type semiconductor layer;
  the third electrode 504 is electrically connected to the detection pixel circuit 02;
  the fourth electrode 505 is a transparent electrode and configured to load a bias voltage; and the fourth electrode 505 is located on the side, facing away from the third electrode 504, of the indirect conversion material layer 506.

During the X-ray detection process, the scintillator layer 07 converts X-rays into visible light, the visible light is further converted into carriers by the indirect conversion material layer 506; and electron-hole pairs contained in the carriers drift towards the third electrode 504 and the fourth electrode 505 respectively under the action of an electric field, and are collected by the third electrode 504 and the fourth electrode 505 to generate a current signal.

Figure 7:
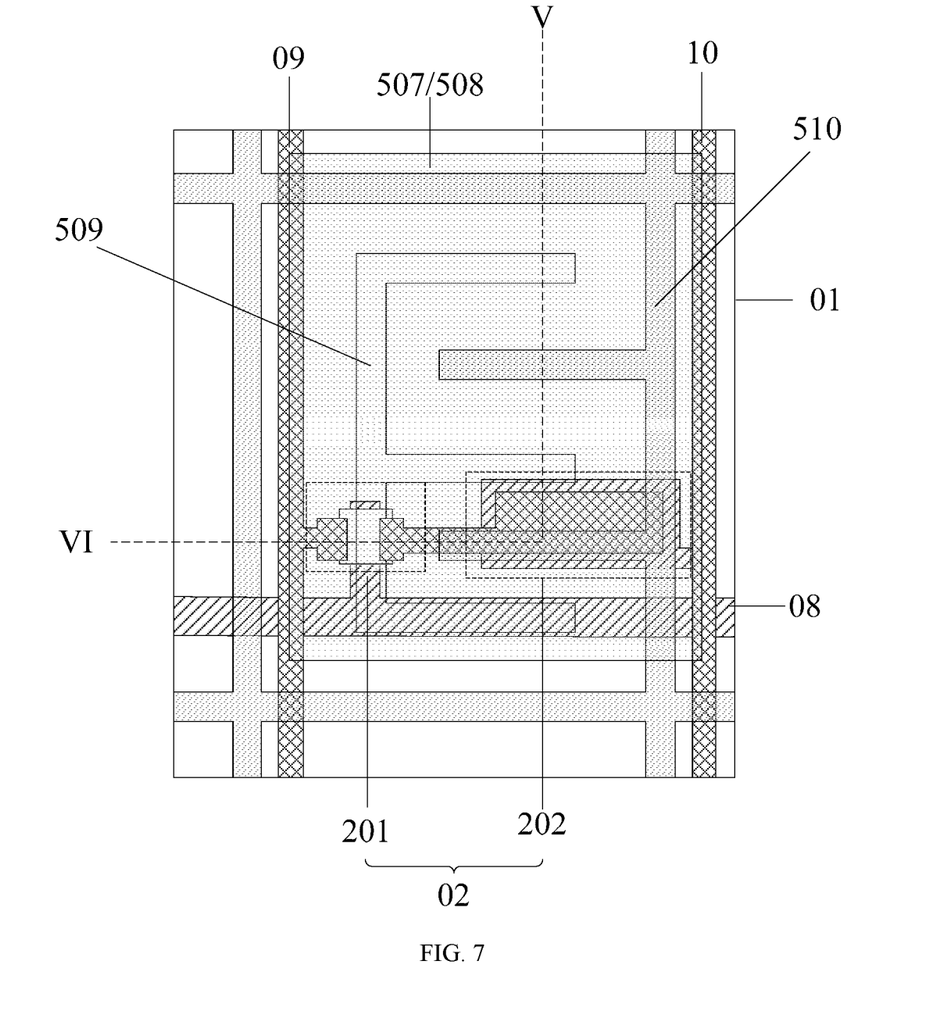
FIG. 7 is a schematic diagram of another planar structure of a detection substrate provided by an embodiment of the present disclosure.
Figure 8:
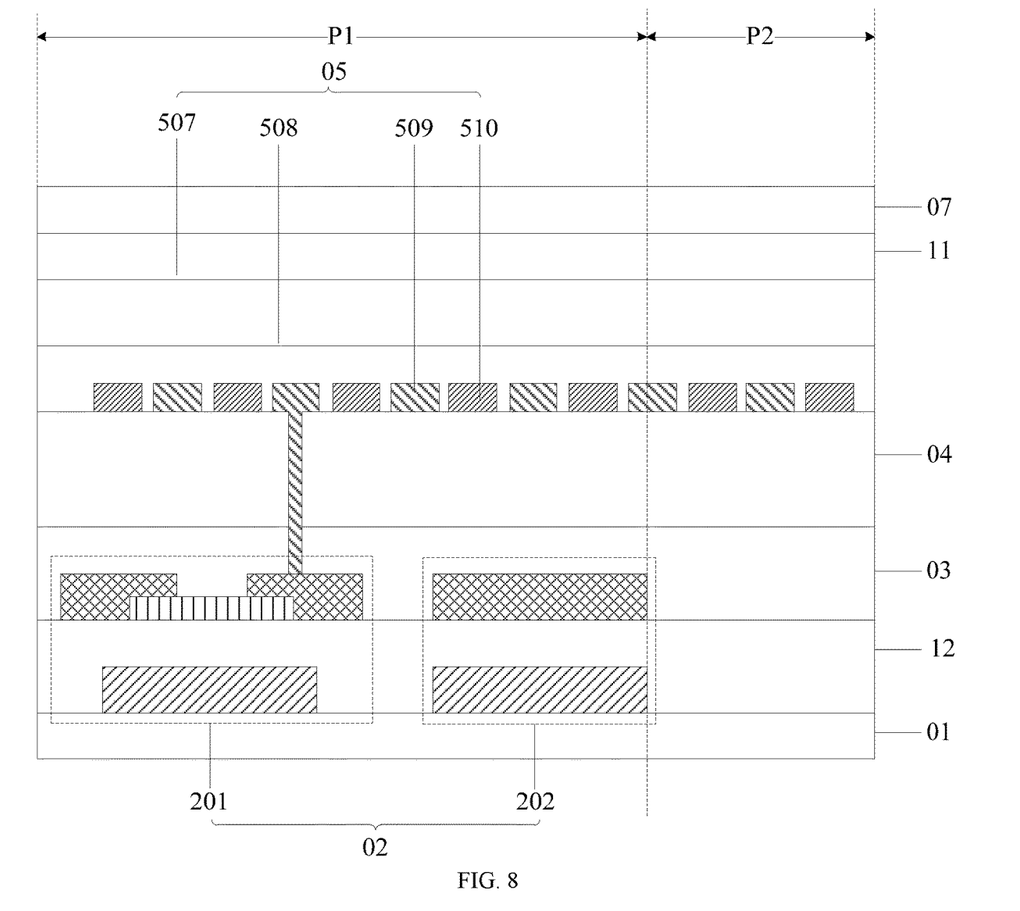
FIG. 8 is a schematic diagram of a sectional structure along the line V-VI in FIG. 7.

Optionally, when the photosensitive device 05 is the MSM-type photosensitive device, as shown in FIG. 7 and FIG. 8, the detection substrate may further include: a scintillator layer 07 located on the side, facing away from the base substrate 01, of the plurality of photosensitive devices 05;
  each photosensitive device 05 may include: a semiconductor layer 507; a dielectric layer 508 located on the side, facing away from the scintillator layer 07, of the semiconductor layer 507; and a fifth electrode 509 and a sixth electrode 510 located between the dielectric layer 508 and the planarization layer 04 and arranged on the same layer; and
  the fifth electrode 509 and the sixth electrode 510 constitute an interdigital electrode, the fifth electrode 509 is electrically connected to the detection pixel circuit 02, and the sixth electrode 510 is configured to load a bias voltage.

During the X-ray detection process, the scintillator layer 07 converts X-rays into visible light; when the visible light is irradiated on the surface of the semiconductor layer 507, the semiconductor layer 507 has a decreased resistance, and most of the high voltages is therefore distributed onto the dielectric layer 508. At this time, the sixth electrode 510, the dielectric layer 508 and the semiconductor layer 507 form a metal-insulator-semiconductor (MIS) structure. The metal-insulator-semiconductor structure undergoes electron tunneling under a high voltage to generate a tunneling current. The tunneling current can be collected by the third electrode 504 and the fourth electrode 505 to generate a current signal.

Optionally, in the above detection substrate provided by the embodiments of the present disclosure, as shown in FIGS. 1 to 8, each detection pixel circuit 02 may include a transistor 201 and a capacitor 202; where a gate of the transistor 201 and a first electrode plate of the capacitor 202 are arranged on the same layer; a source and a drain of the transistor 201 and a second electrode plate of the capacitor 202 are arranged on the same layer; and the drain of the transistor 201 and a second electrode plate of the capacitor 202 are electrically connected to the photosensitive device 05.

It should be understood that, in the present disclosure, "the same layer" refers to a layer structure formed by the following steps: a film layer for forming specific patterns is firstly formed by using the same film forming process, and then the layer structure is formed by a single mask patterning process with the same mask. That is, the single mask patterning process corresponds to one mask. Based on different specific patterns, the single mask patterning process may include multiple exposure, development or etching processes, the specific patterns in the formed layer structure may be continuous or discontinuous, and these specific patterns may also be at different heights or have different thicknesses, thereby simplifying the fabrication process, reducing the fabrication costs and improving the production efficiency.

It should be noted that when the photosensitive device 05 is a PIN-type photosensitive device, it has a relatively large capacitance, so that no additional capacitance design is required. In addition, the transistor 201 may not only be a bottom-gate transistor as shown in FIG. 2, FIG. 3, FIG. 6 and FIG. 8, but also a top-gate transistor as shown in FIG. 4, which is not limited here.

Optionally, the above-mentioned detection substrate provided by the embodiments of the present disclosure, as shown in FIG. 1, FIG. 5, and FIG. 7, may generally further include: a gate line 08 arranged on the same layer as the gate of the transistor 201 and extending in a first direction, and a data line 09 and a reference signal line 10 which are arranged on the same layer as the source and drain of the transistor 201 and extend in a second direction intersecting the first direction. The gate line 08 is electrically connected to the gate of the transistor 201, the data line 09 is electrically connected to the source of the transistor 201, and the reference signal line 10 is electrically connected to the first electrode plate of the capacitor 202. Optionally, in order to increase the filling rate of the detection pixels, the orthographic projections of the photosensitive devices 05 on the base substrate 01 also completely cover the orthographic projection of the gate line 08 on the base substrate 01, and the orthographic projection of the photosensitive device 05 on the base substrate 01 partially overlaps with the orthographic projection of the data line 09 on the base substrate 01 and the orthographic projection of the reference signal line 10 on the base substrate 01.

Optionally, the above-mentioned detection substrate provided by the embodiments of the present disclosure, as shown in FIG. 2, FIG. 3, FIG. 4, FIG. 6 and FIG. 8, may generally further include a packaging layer 11, a gate insulation layer 12 and an interlayer insulation layer 13. The materials of the packaging layer 11, the gate insulation layer 12 and the interlayer insulation layer 13 may be silicon oxide, silicon nitride, etc.

Figure 9A:
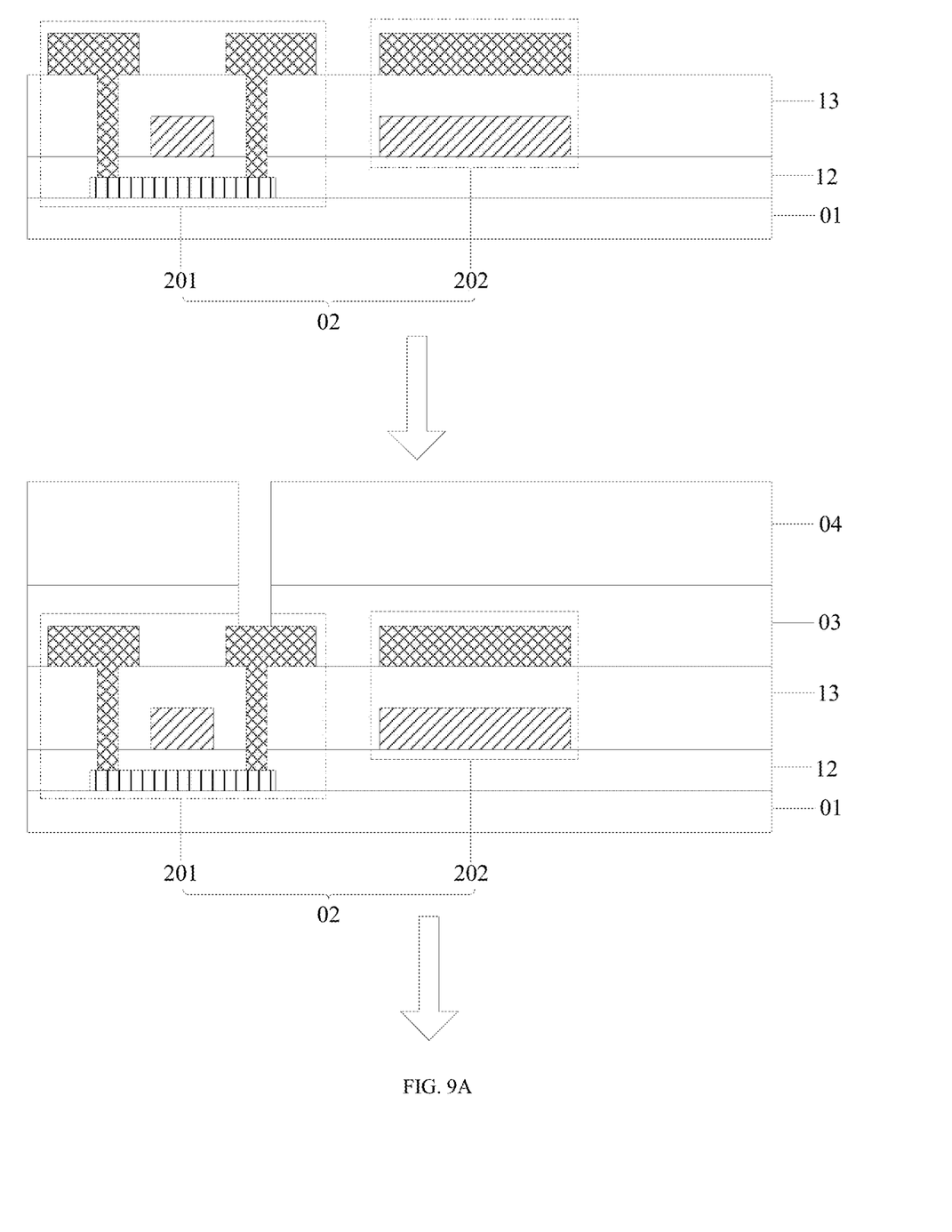
FIGS. 9A-9B is a fabrication flow chart of the detection substrate shown in FIG. 4.
Figure 9B:
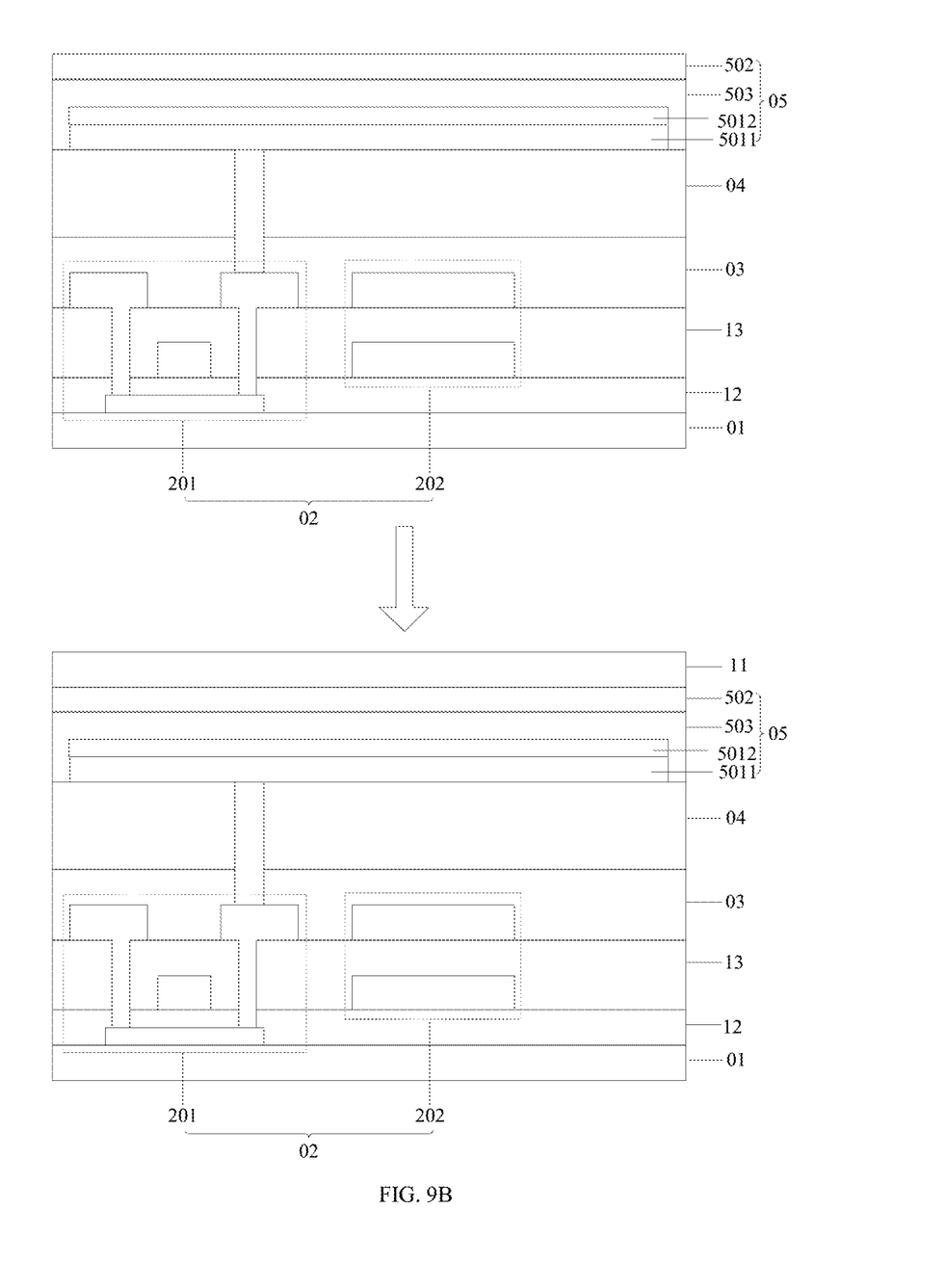

In order to better understand the technical solution of the present disclosure, the fabricating process of the detection substrate shown in FIG. 4 will be introduced below, as shown in FIGS. 9A-9B, which specifically includes the following steps.

Step 1, an active layer of a transistor 201 a gate insulation layer 12, a gate line 08, a gate of the transistor 201, a first electrode plate of a capacitor 202, an interlayer insulation layer 13, a data line 09, a reference signal line 10, a source/drain of the transistor 201 and a second electrode plate of the capacitor 202 are formed on the base substrate 01 sequentially; where the gate line 08, the gate of the transistor 201, the first electrode plate of the capacitor 202 are arranged on the same layer; and the data line 09, the reference signal line 10, the source/drain of the transistor 201 and the second electrode plate of the capacitor 202 are arranged on the same layer; where the gate line 08 is electrically connected to the gate of the transistor 201, the data line 09 is electrically connected to the source of the transistor 201, and the reference signal line 10 is electrically connected to the first electrode plate of the capacitor.

Step 2, a first passivation layer 03 is deposited on the layer on which the data line 09, the reference signal line 10, the source/drain of the transistor 201 and the second electrode plate of the capacitor 202 are located; then the first passivation layer is coated with a lightproof resin layer to fabricate a planarization layer 04; and after perforating the planarization layer 04 according to design requirements, the corresponding positions of the first passivation layer 03 are perforated.

Step 3, a molybdenum metal film with a thickness of 220 nm and an indium tin oxide film with a thickness of 135 nm are deposited on the planarization layer 04, and the molybdenum metal film and the indium tin oxide film are patterned to obtain a first electrode 501 completely covering the detection pixel circuit 02 in each detection pixel area. Specifically, the first electrode 501 includes a light-shielding metal layer 5011 made of molybdenum metal and a light-transmitting metal oxide layer 5012 made of indium tin oxide. Then mercury iodide ($HgI_2$), lead iodide ($PbI_2$), bismuth iodide ($BiI_2$), etc. are deposited on the first electrode 501 by an evaporation method to form a direct conversion material layer 503; afterwards a 3000 Å thick molybdenum metal film is deposited; and the molybdenum metal film is patterned to obtain a second electrode 502 completely covering the detection pixel circuit 02 in each detection pixel area. The first electrode 501, the direct conversion material layer 503 and the second electrode 502 constitute a photosensitive device 05.

Step 4, 5000 Å thick silicon oxide or silicon nitride is deposited on the layer on which the second electrode 502 is located by using a chemical vapor deposition (PECVD) method to complete the fabrication of a packaging layer 11 to realize the packaging of the entire device.

So far, the fabrication of the detection substrate shown in FIG. 4 is completed.

Based on the same inventive concept, embodiments of the present disclosure also provide a ray detector, including the detection substrates provided by the embodiments of the present disclosure. The other indispensable components of the ray detector are understood by those of ordinary skill in the art, which will not be repeated here, and should not be used as a limitation to the present disclosure. In addition, since the problem solving principle of the ray detector is similar to the problem solving principle of the detection substrate, the implementation of the ray detector can refer to the embodiments of the detection substrate, and will not be repeated.

The above-mentioned detection substrate and the ray detector provided by the embodiments of the present disclosure, include: a base substrate; a plurality of detection pixel circuits, located on the base substrate; a first passivation layer, located on the side, facing away from the base substrate, of the plurality of detection pixel circuits; a planarization layer, located on the side, facing away from the base substrate, of the first passivation layer, where the surface of the side, facing away from the first passivation layer, of the planarization layer is a plane; a plurality of photosensitive devices, where the plurality of photosensitive devices are correspondingly electrically connected to the plurality of detection pixel circuits in a one-to-one correspondence through vias penetrating through the first passivation layer and the planarization layer; each photosensitive device includes a first portion and a second portion; the orthographic projection of the first portion on the base substrate and the orthographic projection of the detection pixel circuit correspondingly electrically connected with the first portion on the base substrate overlap each other; and the orthographic projection of the second portion on the base substrate and the orthographic projection of the detection pixel circuit correspondingly electrically connected with the second portion on the base substrate do not overlap with each other. Since the surface of the side, facing away from the first passivation layer, of the planarization layer in the present disclosure is a plane with good uniformity, the uniformity of the film layers of the photosensitive devices fabricated on the planarization layer is good; and further the photosensitive device can include the first portion that overlaps with the detection pixel circuit and the second portion that does not overlap with the detection pixel circuit. Compared with the technical solution in the related art that the photosensitive device and the detection pixel circuit do not overlap each other, the present disclosure increases the filling rate of the detection pixels due to the fact that the photosensitive device can overlap with the detection pixel circuit.

Obviously, those skilled in the art can make various changes and variations to the present disclosure without departing from the spirit and scope of the present disclosure. In this way, if these modifications and variations of the present disclosure fall within the scope of the claims of the present disclosure and their equivalent technologies, the present disclosure is also intended to include these changes and variations.

What is claimed is:

1. A detection substrate, comprising:
a base substrate;
a plurality of detection pixel circuits, arranged on the base substrate;
a first passivation layer, arranged on a side, facing away from the base substrate, of the plurality of detection pixel circuits;
a planarization layer, arranged on a side, facing away from the base substrate, of the first passivation layer; wherein a surface of the side, facing away from the first passivation layer, of the planarization layer is a plane, and the planarization layer is a lightproof resin layer; and
a plurality of photosensitive devices;
wherein the plurality of photosensitive devices are electrically connected to the plurality of detection pixel circuits in a one-to-one correspondence through vias penetrating through the first passivation layer and the planarization layer;
each of the plurality of photosensitive devices comprises a first portion and a second portion;
an orthographic projection of the first portion on the base substrate and an orthographic projection of a detection pixel circuit correspondingly electrically connected with the first portion on the base substrate overlap each other; and
an orthographic projection of the second portion on the base substrate and an orthographic projection of a detection pixel circuit correspondingly electrically connected with the second portion on the base substrate do not overlap each other.

2. The detection substrate according to claim 1, wherein the planarization layer has a thickness of 1 µm-10 µm in a direction perpendicular to the base substrate.

3. The detection substrate according to claim 1, further comprising a second passivation layer arranged between the planarization layer and the plurality of photosensitive devices.

4. The detection substrate according to claim 1, wherein the each photosensitive device comprises:
a first electrode and a second electrode that are opposite to each other, and
a direct conversion material layer arranged between the first electrode and the second electrode;
wherein the first electrode is electrically connected to a detection pixel circuit;
the second electrode is arranged on a side, facing away from the first electrode, of the direct conversion material layer; and
the second electrode is configured to load a bias voltage.

5. The detection substrate according to claim 4, wherein the first electrode comprises a light-shielding metal layer, and a light-transmitting metal oxide layer arranged between the light-shielding metal layer and the direct conversion material layer.

6. The detection substrate according to claim 1, further comprising a scintillator layer arranged on the side, facing away from the base substrate, of the plurality of photosensitive devices;
wherein the each photosensitive device comprises: a third electrode and a fourth electrode that are opposite to each other, and an indirect conversion material layer arranged between the third electrode and the fourth electrode;
the indirect conversion material layer comprises an N-type semiconductor layer, an intrinsic semiconductor layer and a P-type semiconductor layer;
the third electrode is electrically connected to a detection pixel circuit;
the fourth electrode is a transparent electrode and configured to load a bias voltage; and
the fourth electrode is arranged on a side, facing away from the third electrode, of the indirect conversion material layer.

7. The detection substrate according to claim 1, further comprising a scintillator layer arranged on the side, facing away from the base substrate, of the plurality of photosensitive devices;

wherein the each photosensitive device comprises:
      a semiconductor layer;
      a dielectric layer arranged on a side, facing away from the scintillator layer, of the semiconductor layer; and
      a fifth electrode and a sixth electrode arranged between the dielectric layer and the planarization layer and arranged on a same layer;
      wherein the fifth electrode and the sixth electrode constitute an interdigital electrode, the fifth electrode is electrically connected to a detection pixel circuit, and the sixth electrode is configured to load a bias voltage.

8. The detection substrate according to claim 1, wherein each of the plurality of detection pixel circuit comprises a transistor and a capacitor;

wherein a gate of the transistor and a first electrode plate of the capacitor are arranged on a same layer; and
   a source and a drain of the transistor and a second electrode plate of the capacitor are arranged on a same layer; and
   the drain of the transistor and the second electrode plate of the capacitor are electrically connected to a photosensitive device.

9. The detection substrate according to claim 8, further comprising:

a gate line arranged on the same layer as the gate of the transistor and extending in a first direction; and
   a data line and a reference signal line arranged on the same layer as the source and drain of the transistor and extending in a second direction intersecting the first direction;
   wherein the gate line is electrically connected to the gate of the transistor, the data line is electrically connected to the source of the transistor, and the reference signal line is electrically connected to the first electrode plate of the capacitor.

10. The detection substrate according to claim 9, wherein orthographic projections of the plurality of photosensitive devices on the base substrate completely cover an orthographic projection of the gate line on the base substrate; and an orthographic projection of the each photosensitive device on the base substrate partially overlaps with an orthographic projection of the data line on the base substrate and an orthographic projection of the reference signal line on the base substrate.

11. A ray detector, comprising the detection substrate according to claim 1.

* * * * *